United States Patent [19]

Jung et al.

[11] Patent Number: 5,467,313
[45] Date of Patent: Nov. 14, 1995

[54] LEVEL SHIFTER AND DATA OUTPUT BUFFER HAVING SAME

[75] Inventors: Chul-min Jung; Jeong-hee Lee, both of Seoul; Kee-sik Ahn, Kyungki; Hee-chul Park, Suwon, all of Rep. of Korea

[73] Assignee: Samsung Electronics Co., Ltd., Suwon, Rep. of Korea

[21] Appl. No.: 273,746

[22] Filed: Jul. 12, 1994

[30] Foreign Application Priority Data

Jul. 28, 1993 [KR]  Rep. of Korea ............... 93-14563

[51] Int. Cl.$^6$ .................... G11C 7/00; H03K 19/02
[52] U.S. Cl. ................ 365/189.11; 365/189.06; 365/194; 326/66; 326/73
[58] Field of Search ............ 365/189.11, 189.06, 365/194; 326/66, 73

[56] References Cited

U.S. PATENT DOCUMENTS

| | | | |
|---|---|---|---|
| 4,897,820 | 1/1990 | Shiomi et al. | 365/189.11 |
| 4,964,083 | 10/1990 | Nogle et al. | 365/189.11 |
| 4,972,374 | 11/1990 | Wang et al. | 365/189.11 X |
| 5,027,323 | 6/1991 | Miyamoto et al. | 365/189.11 |
| 5,153,465 | 10/1992 | Sandhu | 326/73 |
| 5,162,677 | 11/1992 | Takahashi | 326/66 |
| 5,210,715 | 5/1993 | Houston | 365/194 |

Primary Examiner—David C. Nelms
Assistant Examiner—Son Dinh
Attorney, Agent, or Firm—Stephen R. Whitt; Charles R. Donohoe

[57] ABSTRACT

A level shifter and a data output buffer adapted for use in a semiconductor memory device including a memory cell for storing data, a sense amplifier for amplifying data read from the memory cell and generating an ECL-level output signal, and a level shifter for converting the ECL-level output signals into a CMOS-level signal, wherein the level shifter has a level shifting means receiving the ECL-level data signals, converting the input data to CMOS-levels, and outputting a result, and a delay for delaying the result so as to control its current consumption of the level shifter.

19 Claims, 4 Drawing Sheets

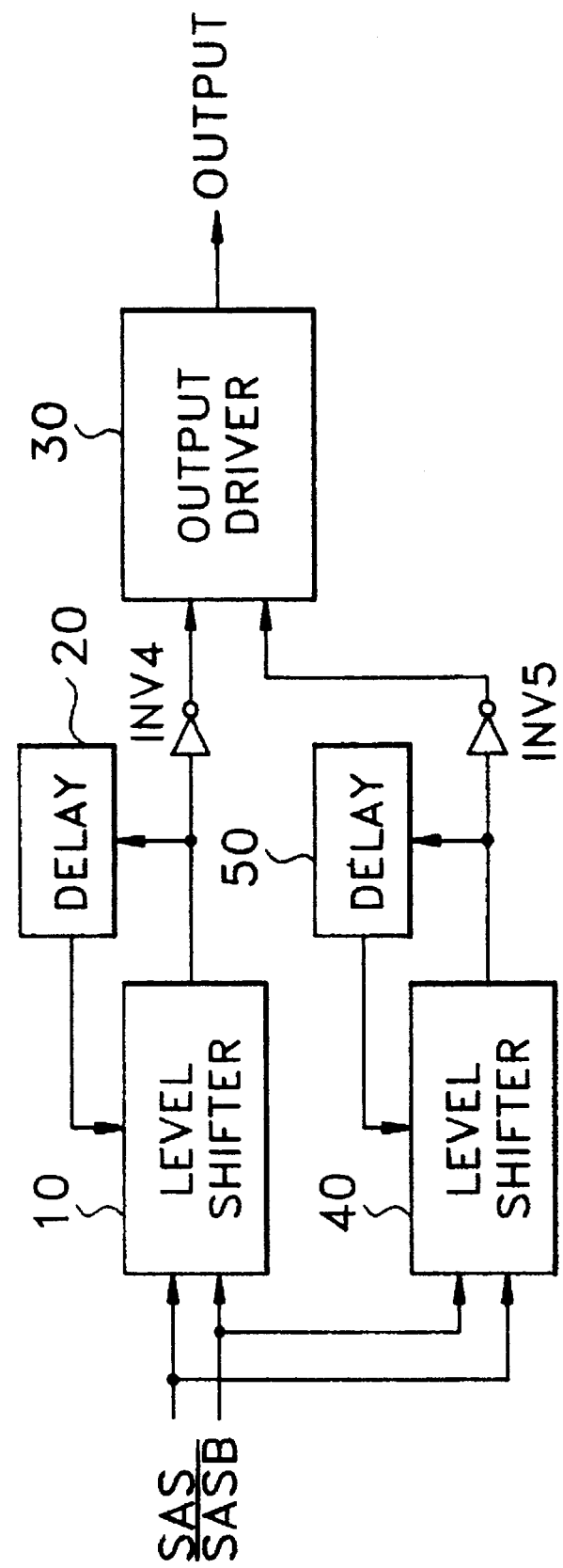

LEVEL SHIFTER AND DATA OUTPUT BUFFER HAVING SAME

BACKGROUND OF THE INVENTION

The present invention relates to a semiconductor memory device, and more particularly, to a level shifter and a data output buffer having the level shifter adapted for use in a semiconductor memory device.

Conventional semiconductor memory devices are generally implemented in CMOS. CMOS memory devices operate at a lower speed than BiCMOS semiconductor memory devices. One reason for this difference is the fact that conventional BiCMOS memory devices process input signals at emitter-coupled logic (ECL) levels. However, when ECL-level signals are subsequently output a large output signal margin is required to operate with external circuitry. This requirement necessitates a level shifter to convert the ECL-level signals into CMOS levels for output from the semiconductor memory device.

FIG. 1 is a block diagram showing a conventional data output buffer in a semiconductor memory device. The data output buffer of FIG. 1 includes level shifters 1 and 3 which receive signals SAS and $\overline{SAS}$ (the inverse of SAS) at bipolar logic levels from a sense amplifier (not shown). Input signals SAS and $\overline{SAS}$ are level shifted by level shifters 1 and 3. The data output buffer of FIG. 1 also includes an output driver 2 for driving (boosting) the output voltages D1 and D2, the output of level shifters 1 and 2, respectively.

FIG. 2 is a more detailed circuit diagram of the level shifter shown in FIG. 1. Referring to FIG. 2, level shifter 1 or 3 comprises a PMOS transistor MP1 having a power supply voltage (Vcc) applied to its source, and SAS applied to its gate; a PMOS transistor MP2 having Vcc applied to its source, and $\overline{SAS}$ applied to its gate; an NMOS transistor MN1 having a drain and gate commonly connected to the drain of PMOS transistor MP1 and having a source connected to ground; an NMOS transistor MN2 having a drain connected to the drain of PMOS transistor MP2, having a gate connected to the gate of NMOS transistor MN1, and having a source connected to ground; an NMOS transistor MN3 having a gate connected to the gate of NMOS transistor MN2; an NMOS transistor MN4 having a drain connected to the source of NMOS transistor MN3, having a source connected to ground, and having a gate connected to the drain of NMOS transistor MN3; an NMOS transistor MN5 having an inverse output enable signal (OEB) applied to its gate, having a drain connected to the drain of NMOS transistor MN3, and having a source connected to the source of NMOS transistor MN3; an NPN transistor Q1 having a base connected to the drain of PMOS transistor MP2, having a collector connected to Vcc, and having an emitter connected to the drains of NMOS transistor MN3 and NMOS transistor MN5; an NPN transistor Q2 having a collector connected to the emitter of NPN transistor Q1, having a gate connected to the sources of NMOS transistors MN3 and MN5, and having an emitter connected to ground; a PMOS transistor MP3 having a gate receiving $\overline{SAS}$, having a source connected to Vcc, and having a drain connected to the emitter of NPN transistor Q1; and, an inverter INV1 having an input connected to the drain of PMOS transistor MP3 and having an output forming terminal D1 or D2.

In level shifter 1, PMOS transistor MP3 is used to ensure that "high" (logic level) outputs reach a potential very near Vcc, since the use of NPN transistor Q1 alone may not accomplish this result. Similarly, NMOS transistors MN3, MN4 and MN5 are used to ensure that "low" outputs are at ground potential.

The operation of conventional data output buffers will be described below. In the following description SAS and $\overline{SAS}$ are assumed to be amplifier output signals from a bipolar sense amplifier designed to have a voltage swing width of approximately 1 V.

If the power supply voltage is 3 V and output signals SAS and $\overline{SAS}$ swing roughly from 1 V to 2 V, PMOS transistors MP1 and MP2 will always waste a certain amount of voltage. If output signal SAS is 1 V while inverse output signal $\overline{SAS}$ is 2 V, the current which flows via PMOS transistor MP1 is higher than that flowing via PMOS transistor MP2. This means that the current flowing through NMOS transistor MN2 and comprising a current mirror, is higher than that flowing through PMOS transistor MP2. Thus, the output of level shifter 1 drops to a low level.

On the contrary, if signal SAS is 2 V while signal $\overline{SAS}$ is 1 V, the current flowing through PMOS transistor MP2 is higher than that through NMOS transistor MN2. Therefore, the output of level shifter 1 rises to a high level. In other words, it is possible to provide a full swing output for inputs having a voltage swing width of 1 V to 2 V. When the output signal of level shifter 1 is input so as to drive NPN transistors Q1 and Q2, output signal D1 swings completely from a high level to a low level, to thereby operate output driver 2.

Output driver 2 shown in FIG. 2B comprises an NPN transistor Q6 receiving output D1 from level shifter 1, and an NMOS transistor MN6 receiving output D2 from level shifter 3. With this configuration output driver 2 performs a data buffering action according to the output of level shifters 1 and 3.

The foregoing conventional data output buffer is not without its problems. Input signals SAS and $\overline{SAS}$ often fluctuate from their nominal levels. For example, SAS may vary to 1.3 V and $\overline{SAS}$ may vary to 1.7 V. In such circumstances, PMOS transistors MP1 and MP2 consume excess current. Furthermore, the currents flowing respectively through PMOS transistors MP1 and MP2 become similar in their level. All of the foregoing necessarily reduces the power voltage operating range.

SUMMARY OF THE INVENTION

The present invention provides a data output buffer for use in a semiconductor memory device which reduces current consumption in a level shifter. The present invention also provides a data output buffer having greater insensitivity to manufacturing process changes and power source voltage fluctuations.

To accomplish the above objects, there is provided a data output buffer adapted for use in a semiconductor memory device comprising a level shifting circuit receiving an ECL-level data signal and an inverse of the ECL-level data signal, converting the received data signals to CMOS levels, and outputting a result signal, and a delay circuit delaying the result signal of the level shifting circuit so as to control current consumption of the level shifting circuit.

BRIEF DESCRIPTION OF THE DRAWINGS

The above objects and advantages of the present invention will become more apparent by describing in detail a preferred embodiment thereof with reference to the attached drawings in which:

FIG. 3 is a block diagram showing an exemplary embodiment of a data output buffer according to the present invention;

DETAILED DESCRIPTION OF THE INVENTION

Figure 1:
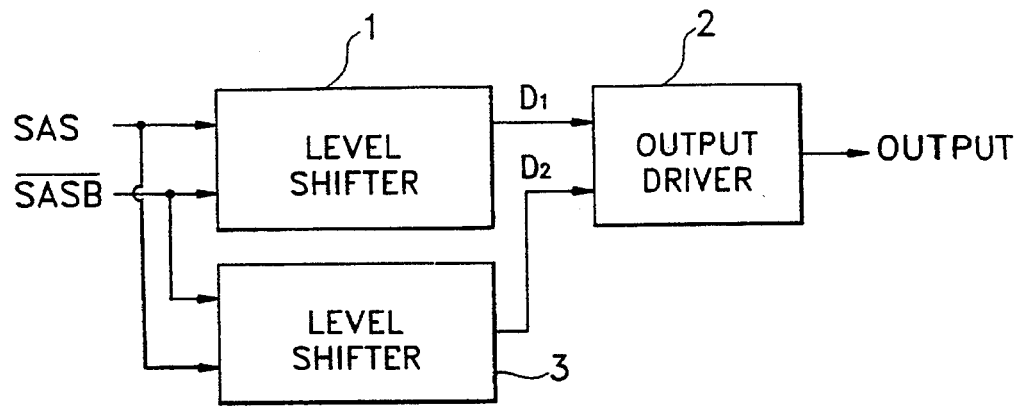
FIG. 1 is a block diagram of a conventional data output buffer.

A data output buffer according to the present invention will be explained in more detail with reference to the attached drawings. FIG. 3 is a block diagram of a data output buffer according to the present invention.

Referring to FIG. 3, the data output buffer comprises level shifters 10 and 40 receiving ECL-level signals SAS and $\overline{SAS}$ from a sense amplifier (not shown). SAS and $\overline{SAS}$ are converted into CMOS-level output signals in level shifter 10 and level shifter 40, respectively. Delay circuits 20 and 50 are respectively associated with level shifter 10 and level shifter 40. Each delay circuit delays the output from its associated level shifter 10 or 40 and feeds the delayed signal back to the associated level shifter 10 and 40. Output driver 30 drives or boosts the voltage output from level shifter 10 through inverter INV4, and the voltage output from level shifter 40 through inverter INV5.

Figure 4:
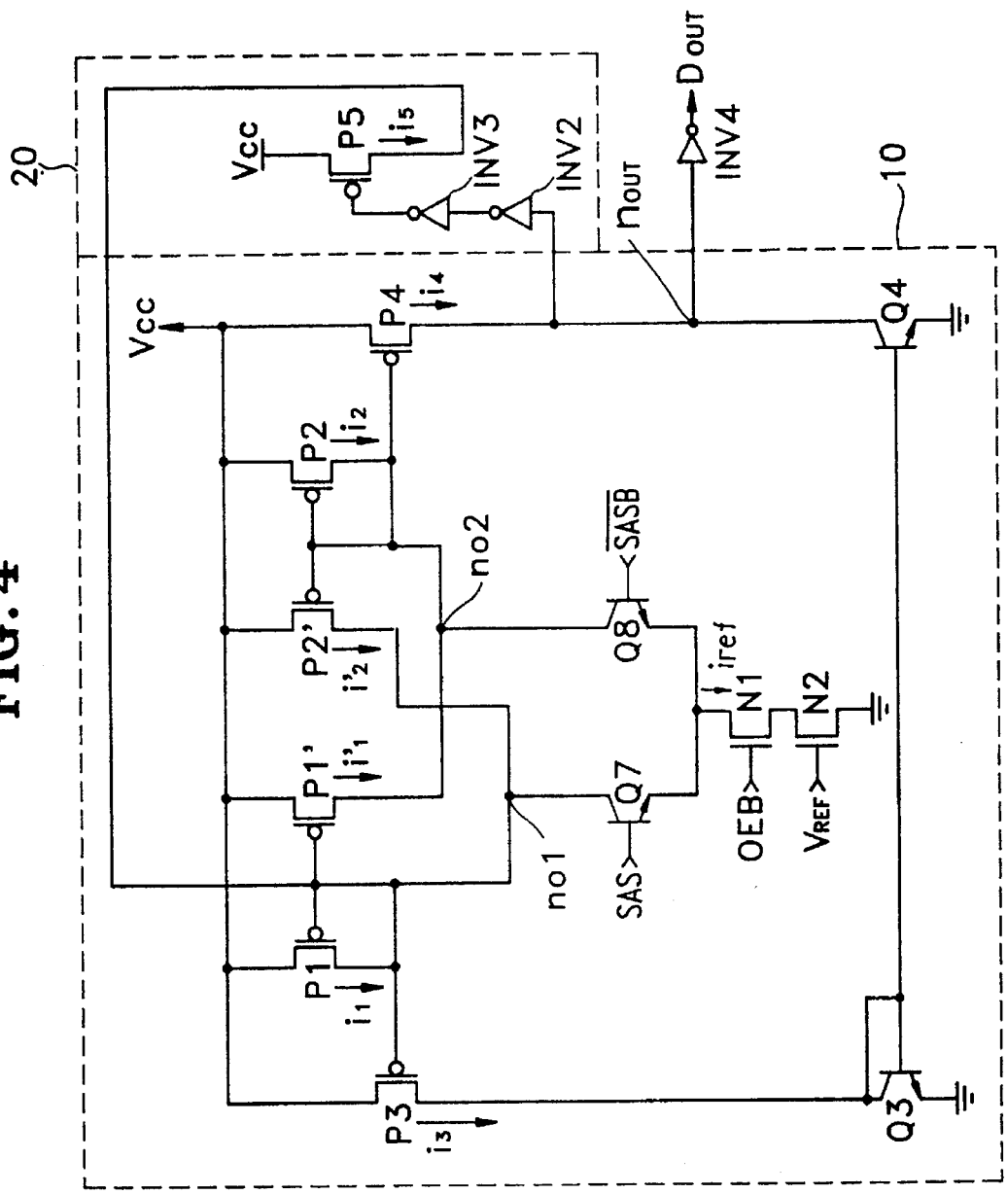
FIG. 4 is a detailed circuit diagram of a first embodiment of the level shifter, and an embodiment the delay circuit shown in FIG. 3.

FIG. 4 is a detailed circuit diagram of a first embodiment of level shifter 10 and delay 20 shown in FIG. 3. Referring to FIG. 4, level shifter 10 (or alternately level shifter 40) comprises an NPN transistor Q7 receiving an ECL-level signal SAS at its base and an NPN transistor Q8 receiving an ECL-level signal $\overline{SAS}$ at its base. The emitters of Q7 and Q8 are commonly connected.

The level shifter further comprises an NMOS transistor N1 having a drain connected to the commonly connected emitters of NPN transistors Q7 and Q8, and having an inverse output enable signal (OEB) applied to its gate; an NMOS transistor N2 having a drain connected to the source of NMOS transistor N1, having a source connected to ground, and having a gate receiving reference voltage $V_{REF}$ as a control signal; a PMOS transistor P1 having a source receiving Vcc, and having a drain and gate commonly connected to the collector of NPN transistor Q7; a PMOS transistor P1' having a gate connected to the gate of PMOS transistor P1, having a source connect to Vcc, and having a drain connected to the collector of NPN transistor Q8; a PMOS transistor P2' having a source connected to Vcc, and having a drain and gate connected to the collector of NPN transistor Q7, a PMOS transistor P2 having a source connected to Vcc, and having a gate and drain commonly connected to the gate of PMOS transistor P2' and to the collector of NPN transistor Q8; a first pull-up PMOS transistor P3 having a source connected to Vcc, and having a gate connected to the gate of PMOS transistor P1; an NPN transistor Q3 having a base base and collector commonly connected to the drain of PMOS transistor P3, and having an emitter connected to ground; a second pull-up PMOS transistor P4 having a gate connected to the drain of PMOS transistor P2, and having a source convected to Vcc; and, an NPN transistor Q4 having a collector connected to the drain of PMOS transistor P4, having an emitter connected to ground, and having a base connected to the base of NPN transistor Q3. Finally, inverter INV4, having an input connected to the drain of PMOS transistor P4, and having an output acting as output terminal Dout, is installed between level shifter 10 and output driver 30.

Delay circuit 20 comprises inverters INV2 and INV3 serially connected to a common node between the drain of PMOS transistor P4 and the collector of NPN transistor Q4, and a PMOS transistor P5 having a gate connected to the output of inverter INV3, having a source receiving Vcc, and having a drain connected via a feedback path to PMOS transistors P1, P1' and P2' at their connection with the gate of first pull-up transistor P3. Delay 20 can also be achieved by coupling a parallel resistance and capacitance network instead of using inverters INV2 and INV3.

Figure 2A:
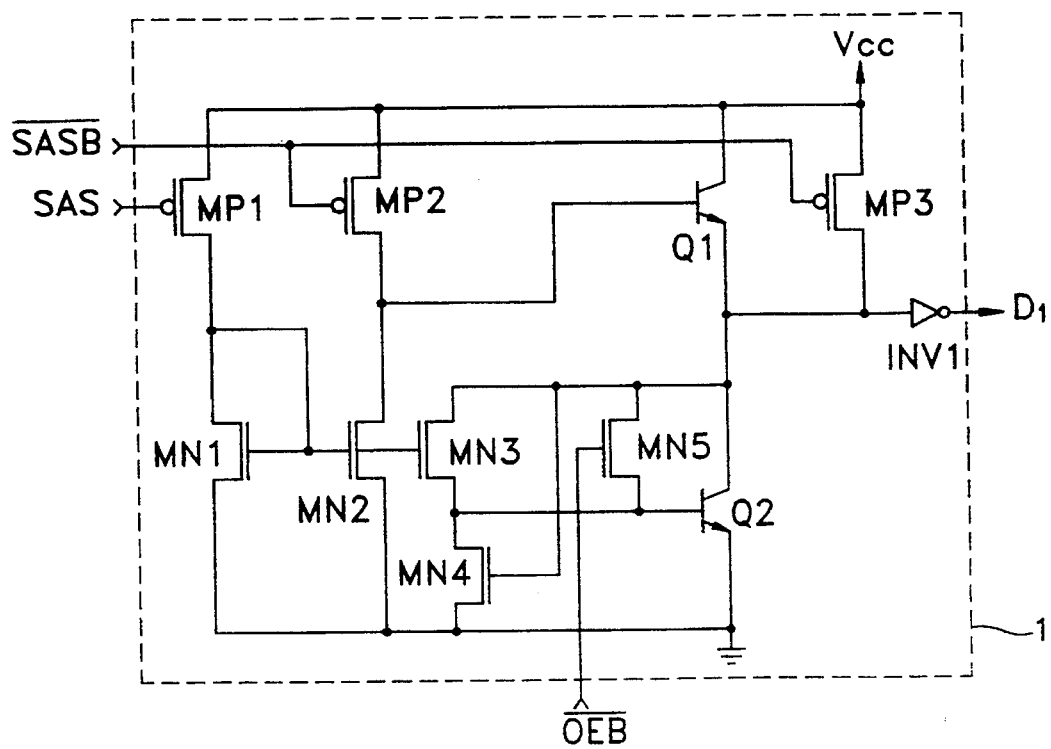
FIG. 2A is a detailed circuit diagrams of the level shifter shown in FIG. 1.
Figure 2B:
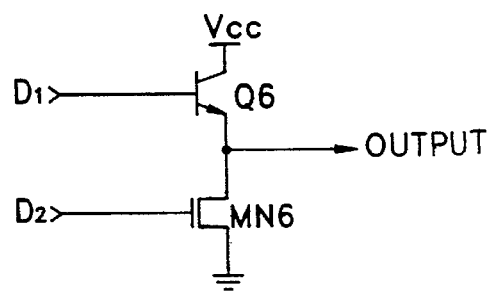
FIG. 2B is a detailed circuit diagram of the output driver shown in FIG. 1.

The structure of output driver 30 in FIG. 3 may be identical to that of output driver 3 of FIG. 1 (shown in detail in FIG. 2B) which has already been described.

The data output buffer according to the present invention operates as follows.

Sense amplifier output signals (SAS and $\overline{SAS}$) are respectively applied to the base of NPN transistors Q7 or Q8. Thus, a voltage difference is generated which clamps a voltage to PMOS transistors P1 and P2. Since signals SAS and $\overline{SAS}$ are applied to bipolar transistors, one of NPN transistors Q7 and Q8 is completely turned ON while the other is turned OFF when a voltage potential difference of approximately 50 mV exists between signals SAS and $\overline{SAS}$. If signal SAS ms higher than signal SAS, the current flowing through NMOS transistor N2 will increase via PMOS transistor P1, and PMOS transistor P1' will supply a current level equal to that of PMOS transistor P1 to the collector of NPN transistor Q8. At this time, the current flowing through PMOS transistor P1' causes an increase in the collector voltage of NPN transistor Q8, since NPN transistor Q8 is in the course of being turned OFF. In doing so, when the collector voltage of NPN transistor Q8 is increased, PMOS transistor P2' is gradually turned OFF via PMOS transistor P2. Thus, the decrease in collector voltage of NPN transistor Q7 increases in speed, such that the increased amount (Δi1) of the current i1 flowing through PMOS transistor P1 and that (Δi2') of current i2' flowing through PMOS transistor PP2' satisfy the expression.

$$\Delta i1 + \Delta i2' \cong 0$$

Thus, the collector voltage of NPN transistor Q7 can be controlled without a load.

Therefore, if the collector voltage of NPN transistor Q7 is lower than that of NPN transistor Q8, current i3 flowing through PMOS transistor P3 increases beyond the level of current i4 flowing through PMOS transistor P4. In normal operation, the current i4 through PMOS transistor P4 is virtually zero, thus applying a Vcc-level voltage at the collector of NPN transistor Q8. At this time, current i3 shifts the drain electrode of PMOS transistor P4 from a high level to a low level via current mirrors of NPN transistors Q3 and Q4. Here, a DC current path is formed from PMOS transistor P3 to NPN transistor Q3, and current i3 has a high value since the charge accumulated in a collector of NPN transistor Q4 has to be discharged.

Delay 20 is employed in order to reduce the high current consumption. If the voltage at the collector of NPN transistor Q7 goes low, and current i3 is much higher than current i4, the collector voltage of NPN transistor Q4 goes low, which turns on PMOS transistor P5 via inverters INV2 and INV3. As a result, the collector voltage of NPN transistor Q7 is increased, which in turn decreases current i3. At this time, the sum of currents i1, i5 and i2' should be lower than a current $i_{ref}$ so that the collector voltage of NPN transistor Q4 does not float. For this purpose, the current-handling capacity of PMOS transistor P5 must be carefully selected and controlled.

The collector voltage of NPN transistor Q7 can be easily shifted to a level lower than that of NPN transistor Q8 by establishing the collector voltage of NPN transistor Q7 as a high level. The time period for shifting NPN transistor Q8 to a low level coincides with the turning on of PMOS transistor P4 and the rise time of the collector voltage of NPN transistor Q4 to a high level. This means that the time period for shifting a logic "high" to a logic "low" is shorter than that for shifting a logic high level to a high level. Thus, a high impedance margin and a low impedance margin of the next terminal can be reduced. The characteristics can erase the point of time for simultaneously turning ON the pull-up and pull-down of a level shifter when an address floating or a skew time testing is performed. Thus, unnecessary power consumption can be eliminated.

Figure 5:
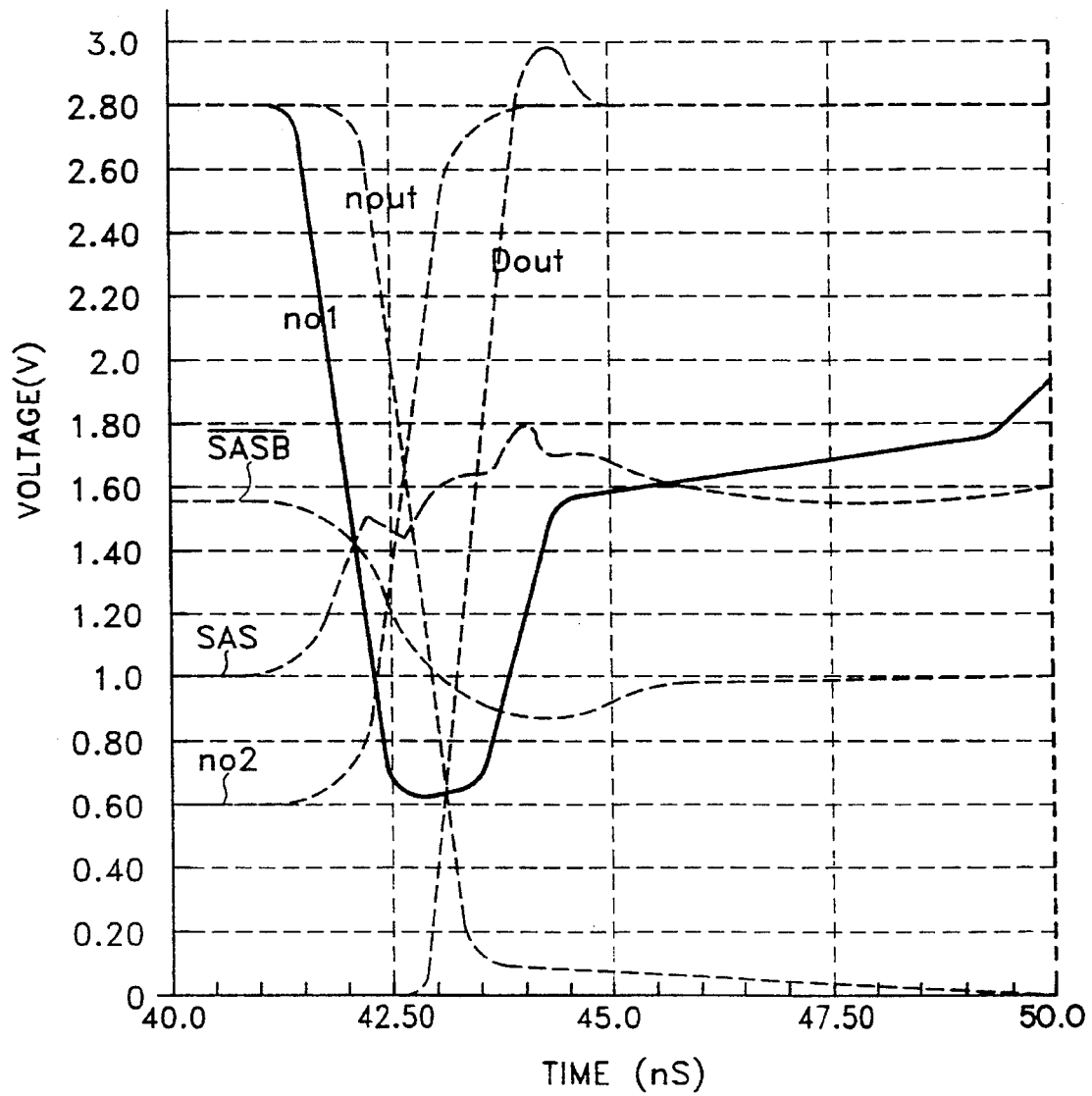
FIG. 5 is a computer simulated timing diagram of the performance of the data output buffer shown in FIG. 4; and, FIG. 6 is a detailed circuit diagram of a second embodiment of the level shifter shown in FIG. 3.

FIG. 5 illustrates a computer simulation of the operation of the circuit shown in FIG. 4, and shows sense amplifier output signals (SAS and $\overline{SAS}$), signals present at two nodes (no1 and no2), and an output node signal (nout) and the inverse signal ($D_{OUT}$) thereof.

FIG. 6 is a detailed circuit diagram of a level shifter and delay of a second embodiment of the present invention. The circuit of FIG. 6 comprises the same elements as those shown and previously described in relation to FIG. 4, except that PMOS transistors P1' and P2' (in FIG. 4) have been excluded.

Here, too, clamping is still possible such that the object of the present invention can be achieved. That is, in the operation of the circuit according to FIG. 6, a level shifter of a semiconductor memory device of the present invention shifts the output signal from an ECL-level sense amplifier into a CMOS-level signal, to thereby widen the operation margin and reduce current consumption.

What is claimed is:

1. A level shifter comprising:
    level shifting means for receiving an ECL-level data signal and an inverse of the ECL-level data signal, converting the received data signals to CMOS levels, and outputting a result signal, the level shifting means comprising:
        a first bipolar transistor having a base receiving the ECL-level data signal, a collector, and emitter;
        a second bipolar transistor having a base receiving the inverse of the ECL-level data signal, a collector, and an emitter, wherein the emitters of the first and second bipolar transistors are commonly connected emitters, and wherein the first and second transistors respond to an enable signal;
        first clamping means, connected between a power source voltage and the collector of the first bipolar transistor, for clamping a first voltage to the first bipolar transistor;
        second clamping means, connected between the power source voltage and the collector of said second bipolar transistor, for clamping a second voltage to the second bipolar transistor;
        a first pull-up transistor having a source connected to the power source voltage and having a gate connected to the collector of Raid first bipolar transistor;
        a second pull-up transistor having a source connected to the power source voltage and having a gate connected to the collector of said second bipolar transistor;
        current mirror means, including third and fourth bipolar transistors, for causing a common current level to flow through the first and second pull-up transistors; and,
    delay means for delaying the result signal of the level shifting means so as to control current consumption of the level shifting means.

2. A level shifter according to claim 1, wherein the first clamping means comprises a first MOS transistor having a source connected to the power source voltage, and a drain and a gate commonly connected.

3. A level shifter according to claim 2, wherein the first clamping means further comprises:
    a second MOS transistor having a gate connected to the gate of the first MOS transistor, a source connected to the power source voltage, and a drain connected to the collector of the second bipolar transistor.

4. A level shifter according to claim 1, wherein the second clamping means comprises a third MOS transistor having a source connected to the power source voltage, and a drain and a gate commonly connected.

5. A level shifter according to claim 4, wherein the second clamping means further comprises:
    a fourth MOS transistor having a source connected to the power source voltage, a gate connected to the gate of the second MOS transistor, and a drain connected to the collector of the first bipolar transistor.

6. A level shifter according to claim 1, wherein the delay means comprises:
    buffer means having an input connected to the drain of the second pull-up transistor and to the current mirror means; and,
    a fifth MOS transistor having a gate connected to the output of the buffer means, a source connected to the power source voltage, and a drain connected to the gate of the first pull-up means.

7. A level shifter according to claim 1, further comprising:
    a first NMOS transistor having a drain connected to the commonly connected emitters of the first and second bipolar transistors and a base receiving the enable signal; and
    a second NMOS transistor having a gate receiving a reference voltage signal, a drain connected to the source of the first NMOS transistor, and a source connected to ground.

8. A semiconductor memory device having a memory cell storing data, a sense amplifier amplifying data read from the memory cell and generating an ECL-level output signal and its inverse, and a level shifter converting the ECL-level output signals into CMOS levels, said level shifter comprising:
    level shifting means for receiving the ECL-level data signal and its inverse, converting the ECL-level data signal and its inverse into CMOS-level signals, and outputting a result signal, the level shifting means comprising:
        a first bipolar transistor having a base receiving the ECL-level data signal, a collector, and emitter;

a second bipolar transistor having a base receiving the inverse of the ECL-level data signal, a collector, and an emitter, wherein the emitters of the first and second bipolar transistors are commonly connected emitters, and wherein the first and second transistors respond to an enable signal;

first clamping means, connected between a power source voltage and the collector of the first bipolar transistor, for clamping a first voltage to the first bipolar transistor;

second clamping means, connected between the power source voltage and the collector of said second bipolar transistor, for clamping a second voltage to the second bipolar transistor;

a first pull-up transistor having a source connected to the power source voltage and having a gate connected to the collector of said first bipolar transistor;

a second pull-up transistor having a source connected to the power source voltage and having a gate connected to the collector of said second bipolar transistor;

current mirror means, including third and fourth bipolar transistors, for causing a common current level to flow through the first and second pull-up transistors; and, delay means for delaying the result signal of the level shifting means so as to control current consumption of the level shifting means.

9. A semiconductor memory device according to claim 8, wherein the first clamping means comprises a first MOS transistor having a source connected to the power source voltage, and a drain and a gate commonly connected.

10. A semiconductor memory device according to claim 8, wherein the first clamping means further comprises:

a second MOS transistor having a gate connected to the gate of the first MOS transistor, a source connected to the power source voltage, and a drain connected to the collector of the second bipolar transistor.

11. A semiconductor memory device according to claim 8, wherein the second clamping means comprises a third MOS transistor having a source connected to the power source voltage, and a drain and a gate commonly connected.

12. A semiconductor memory device according to claim 11, wherein the second clamping means further comprises:

a fourth MOS transistor having a source connected to the power source voltage, a gate connected to the gate of the second MOS transistor, and a drain connected to the collector of the first bipolar transistor.

13. A semiconductor memory device according to claim 8, wherein the delay means comprises:

at least one buffer means having a drain connected to the second pull-up transistor and an input connected to the current mirror means; and a MOS transistor having a gate connected to an output terminal of the-at least one buffer means, a source connected to the power source voltage, and a drain connected to the gate.

14. A semiconductor memory device according to claim 8, further comprising:

a first NMOS transistor having a drain connected to the commonly connected emitters of the first and second bipolar transistors, and a base receiving an inverse output enable signal; and a second NMOS transistor having a drain connected to the source of the first NMOS transistor, a gate receiving a reference voltage control signal, and a source connected to ground.

15. A data output buffer comprising:

a level shifter receiving an ECL-level data signal and an inverse ECL-level data signal, shifting the data signals levels, and generating a result, the level shifter comprising:

a first bipolar transistor having a base receiving the ECL-level data signal, a collector, and emitter;

a second bipolar transistor having a base receiving the inverse of the ECL-level data signal, a collector, and an emitter, wherein the emitters of the first and second bipolar transistors are commonly connected emitters, and wherein the first and second transistors respond to an enable signal;

first clamping means, connected between a power source voltage and the collector of the first bipolar transistor, for clamping a first voltage to the first bipolar transistor;

second clamping means, connected between the power source voltage and the collector of said second bipolar transistor, for clamping a second voltage to the second bipolar transistor;

a first pull-up transistor having a source connected to the power source voltage and having a gate connected to the collector of said first bipolar transistor;

a second pull-up transistor having a source connected to the power source voltage and having a gate connected to the collector of said second bipolar transistor;

current mirror means, including third and fourth bipolar transistors, for causing a common current level to flow through the first and second pull-up transistors;

a delay circuit delaying the result of the level shifter; and an output driver receiving the result of the level shifter and producing an output data signal.

16. A data output buffer according to claim 15, wherein the first clamping means comprises a first MOS transistor having a source connected to the power source voltage, and a drain and a gate commonly connected.

17. A level shifter according to claim 16, wherein the first clamping means further comprises:

a second MOS transistor having a gate connected to the gate of the first MOS transistor, a source connected to the power source voltage, and a drain connected to the collector of the second bipolar transistor.

18. A level shifter according to claim 15, wherein the second clamping means comprises a third MOS transistor having a source connected to the power source voltage, and a drain and a gate commonly connected.

19. A level shifter according to claim 18, wherein the second clamping means further comprises:

a fourth MOS transistor having a source connected to the power source voltage, a gate connected to the gate of the second MOS transistor, and a drain connected to the collector of the first bipolar transistor.

* * * * *